(12) United States Patent
Katagawa

(10) Patent No.: US 10,567,766 B2
(45) Date of Patent: Feb. 18, 2020

(54) IMAGE PICKUP APPARATUS, METHOD OF CONTROLLING IMAGING APPARATUS, PROGRAM, AND STORAGE MEDIUM, USING DIFFERENT COMPRESSION PROCESSES FOR IMAGING AND NON-IMAGING PIXEL DATA

(71) Applicant: CANON KABUSHIKI KAISHA, Tokyo (JP)

(72) Inventor: Hiroyasu Katagawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 6 days.

(21) Appl. No.: 15/169,053

(22) Filed: May 31, 2016

(65) Prior Publication Data
US 2016/0360136 A1 Dec. 8, 2016

(30) Foreign Application Priority Data
Jun. 2, 2015 (JP) .................... 2015-112013

(51) Int. Cl.
*H04N 19/124* (2014.01)
*H04N 5/369* (2011.01)
(Continued)

(52) U.S. Cl.
CPC ....... *H04N 19/124* (2014.11); *H04N 5/23212* (2013.01); *H04N 5/36961* (2018.08); *H04N 5/36963* (2018.08)

(58) Field of Classification Search
CPC .... H04N 5/378; H04N 19/174; H04N 19/146; H04N 19/124; H04N 5/23212;
(Continued)

(56) References Cited

U.S. PATENT DOCUMENTS

2004/0042668 A1* 3/2004 Kaplinsky ................ G06T 1/20
382/232
2006/0285761 A1* 12/2006 Kasperkiewicz .. H04N 1/32101
382/254
(Continued)

FOREIGN PATENT DOCUMENTS

CN 103297723 A 9/2013
JP 2001-119631 A 4/2001
(Continued)

OTHER PUBLICATIONS

The above documents were cited in a British Search Report dated Nov. 22, 2016, which is enclosed, that issued in the corresponding British Patent Application No. 1609648.9.
(Continued)

*Primary Examiner* — Albert H Cutler
(74) *Attorney, Agent, or Firm* — Cowan, Liebowitz & Latman, P.C.

(57) ABSTRACT

An imaging element includes a pixel unit configured to receive incident light and include a photoelectric conversion unit performing photoelectric conversion. The imaging element performs a compression process on a first signal which is an imaging signal output from the pixel unit. The imaging element performs a different process from the compression process on a second signal with a different use from the first signal output from the pixel unit so that the second signal does not deteriorate.

14 Claims, 10 Drawing Sheets

(51) Int. Cl.

| | | |
|---|---|---|
| *H04N 5/232* | (2006.01) | |
| *H04N 19/503* | (2014.01) | |
| *H04N 19/174* | (2014.01) | |
| *H04N 19/146* | (2014.01) | |
| *H04N 5/335* | (2011.01) | |
| *H04N 5/217* | (2011.01) | |
| *H04N 19/176* | (2014.01) | |
| *H04N 19/136* | (2014.01) | |
| *H04N 19/00* | (2014.01) | |
| *H04N 9/04* | (2006.01) | |
| *G06T 9/00* | (2006.01) | |
| *G02B 7/34* | (2006.01) | |
| *G02B 7/28* | (2006.01) | |

(58) Field of Classification Search
CPC ..... H04N 19/503; H04N 5/369–36965; H04N 5/36963; H04N 5/36961; H04N 5/335; H04N 5/2176; H04N 5/217; H04N 19/176; H04N 19/136; H04N 19/00; H04N 9/045; H04N 5/3696; G06T 9/00; G02B 7/34; G02B 7/28
See application file for complete search history.

(56) References Cited

U.S. PATENT DOCUMENTS

| | | | | |
|---|---|---|---|---|
| 2007/0223824 | A1* | 9/2007 | Kato | H04N 5/335 382/232 |
| 2008/0152215 | A1 | 6/2008 | Horie et al. | |
| 2008/0193026 | A1 | 8/2008 | Horie et al. | |
| 2010/0142839 | A1 | 6/2010 | Lakus-Becker | |
| 2010/0188522 | A1 | 7/2010 | Ohnishi et al. | |
| 2011/0115493 | A1* | 5/2011 | Huang | H04N 17/002 324/527 |
| 2012/0038549 | A1* | 2/2012 | Mandella | G06F 3/011 345/156 |
| 2013/0044256 | A1 | 2/2013 | Hiasa et al. | |
| 2013/0176408 | A1 | 7/2013 | Ikeda | |
| 2013/0293737 | A1* | 11/2013 | Yim | H04N 5/23212 348/222.1 |
| 2014/0146188 | A1* | 5/2014 | Ju | H04N 5/23241 348/207.1 |
| 2014/0192239 | A1* | 7/2014 | Ajito | H04N 5/243 348/252 |
| 2015/0002666 | A1 | 1/2015 | Yang et al. | |
| 2015/0009383 | A1* | 1/2015 | Fujii | H04N 5/347 348/302 |
| 2015/0070545 | A1* | 3/2015 | Ohsawa | H04N 5/3591 348/299 |
| 2015/0124129 | A1 | 5/2015 | Aoki et al. | |
| 2015/0237253 | A1* | 8/2015 | Shimokawa | H04N 5/23212 348/281 |
| 2015/0281539 | A1 | 10/2015 | Ueki et al. | |
| 2016/0007026 | A1* | 1/2016 | Dong | H04N 19/176 375/240.08 |

FOREIGN PATENT DOCUMENTS

| | | |
|---|---|---|
| JP | 2010-129783 A | 6/2010 |
| JP | 2010-258912 A | 11/2010 |
| JP | 2013-235054 A | 11/2013 |
| JP | 2014-103543 A | 6/2014 |
| JP | 2015-081984 A | 4/2015 |
| WO | 2014/080597 A1 | 5/2014 |

OTHER PUBLICATIONS

The above foreign patent documents were cited in the Oct. 24, 2017 Japanese Office Action, which is enclosed with an English Translation, that issued in Japanese Patent Application No. 2015112013.
The above documents was cited in the Feb. 3, 2019 Chinese Office Action, which is enclosed without an English Translation, that issued in the Chinese Patent Application No. 201610387553.6.
The above patent document was cited in a British Search Report dated Oct. 4, 2019, which is enclosed, that issued in the corresponding U.K. Patent Application No. 1912757.0.

* cited by examiner

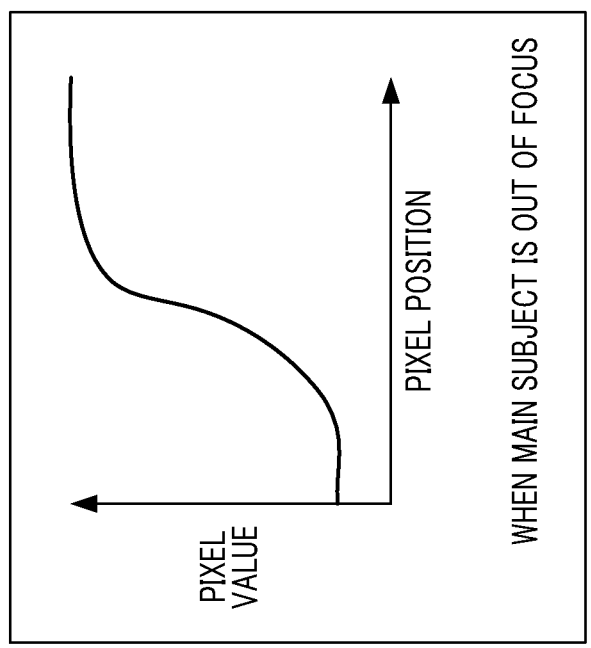
FIG. 12A  WHEN MAIN SUBJECT IS OUT OF FOCUS
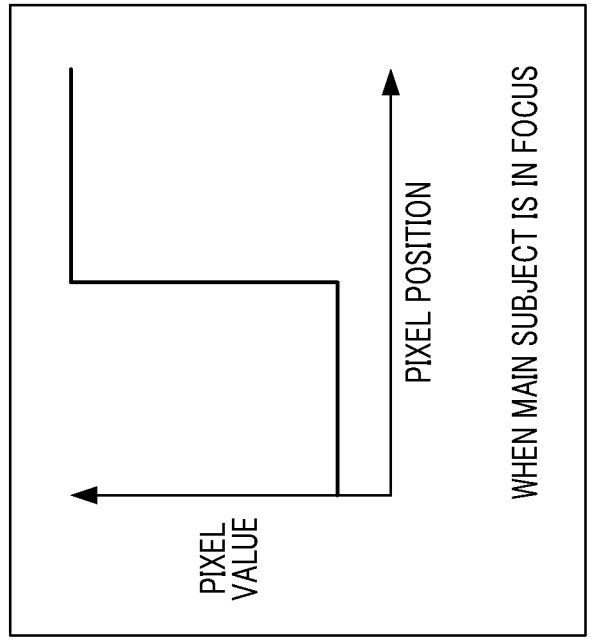
FIG. 12B  WHEN MAIN SUBJECT IS IN FOCUS

IMAGE PICKUP APPARATUS, METHOD OF CONTROLLING IMAGING APPARATUS, PROGRAM, AND STORAGE MEDIUM, USING DIFFERENT COMPRESSION PROCESSES FOR IMAGING AND NON-IMAGING PIXEL DATA

BACKGROUND OF THE INVENTION

Field of the Invention

The present invention relates an imaging element, an image pickup apparatus, a method of controlling the imaging element, a program, and a storage medium.

Description of the Related Art

To realize image pickup apparatuses that have capabilities of high resolution, high-speed consecutive photographing, and high moving-image frame rates, it is necessary to process large amounts of data in the image pickup apparatuses at high speeds compared to the related art. However, when the bandwidths of transmission paths are increased to transmit large amounts of data, cost also increases with the increases in bandwidth. Japanese Patent Laid-Open No. 2014-103543 discloses an image pickup apparatus that includes an imaging element including a compression unit compressing data and is capable of transmitting a large amount of data without increasing the bandwidth of a transmission path by performing a decompression process on compressed image data.

A pixel unit including a photoelectric conversion unit provided in the imaging element includes an imaging pixel that outputs an imaging signal and a functional pixel that outputs a signal having a different use from the imaging signal such as a focus detection signal or a dark current detection signal can be considered. When the same compression process as that for the imaging signal is performed on an output signal of the functional pixels using the imaging element, noise or distortion caused due to the compression process occurs and thus deterioration in a signal occurs.

SUMMARY OF THE INVENTION

The present invention provides an imaging element that compresses and outputs an output from a photoelectric conversion unit included in a pixel unit and is capable of preventing a signal from deteriorating due to compression based on use of an output signal from the pixel unit while enabling a large amount of data to be transmitted without an increase in the bandwidth of a transmission path.

According to an embodiment of the present invention, an imaging element is provided that includes a pixel unit that receives incident light and includes a photoelectric conversion unit performing photoelectric conversion of the incident light to generate an imaging signal; a compression unit configured to perform a compression process on a first signal which is an imaging signal output from the pixel unit; and a control unit configured to perform a process, different from the compression process performed on the first signal, on a second signal so that the second signal does not deteriorate, the second signal being for a different use from the first signal.

According to the present invention, the imaging element can prevent a signal from deteriorating due to compression according to a use of an output signal from the pixel unit while enabling a large amount of data to be transmitted without an increase in the bandwidth of a transmission path.

Further features of the invention will become apparent from the following description of exemplary embodiments with reference to the attached drawings.

BRIEF DESCRIPTION OF THE DRAWINGS

FIGS. 12A and 12B are diagrams illustrating change amounts of pixel values when a main subject is in focus and out of focus.

DESCRIPTION OF THE PRESENT EMBODIMENTS

Hereinafter, an image pickup apparatus according to an embodiment of the present invention will be described with reference to the drawings.

First Embodiment

Figure 1:
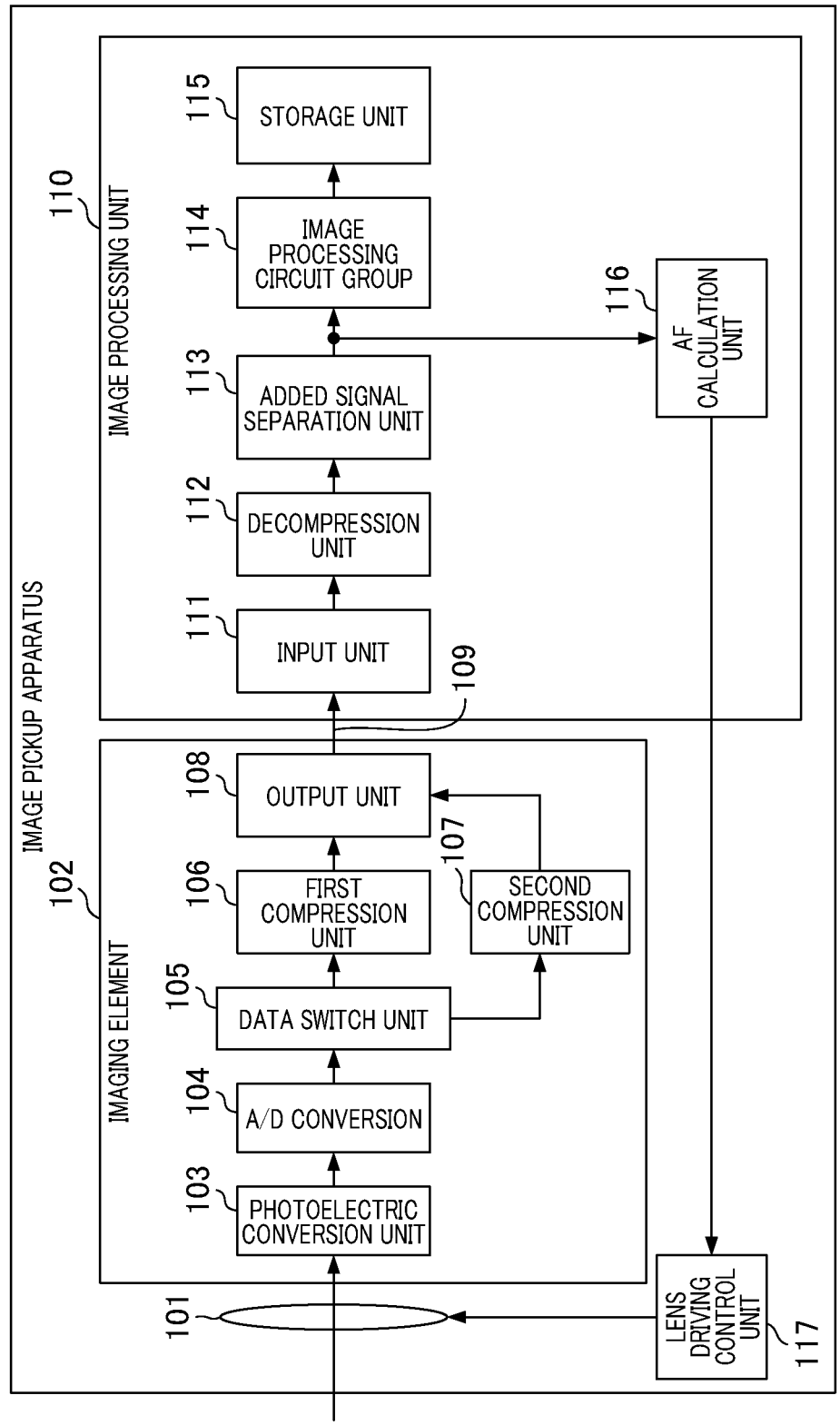
FIG. 1 is a diagram illustrating the configuration of an image pickup apparatus according to a first embodiment.

FIG. 1 is a diagram illustrating the configuration of an image pickup apparatus according to a first embodiment. The image pickup apparatus illustrated in FIG. 1 includes an imaging optical system 101 to a lens driving control unit 117. The imaging optical system 101 receives light from a subject and guides a light flux to an imaging element 102 via a plurality of lens groups and a diaphragm (none of which is illustrated). The light flux passing through the imaging optical system 101 is formed as an optical image on the imaging element 102. The imaging optical system 101 includes a focus lens. The focus lens is driven in an optical axis direction by a driving control command from the lens driving control unit 117 or manual adjustment using a focus ring (not illustrated).

The imaging element 102 includes pixel units that receive incident light and includes photoelectric conversion units 103 performing photoelectric conversion. The imaging element 102 includes an A/D conversion unit 104, a data switch unit 105, a first compression unit 106, a second compression unit 107, and an output unit 108. The output unit 108 includes, for example, an I/O cell or an I/O pin and outputs encoded data supplied from the first compression unit 106 or the second compression unit 107 to the outside of the imaging element 102. The encoded data output by the output unit 108 is supplied to an input unit 111 of the image processing unit 110 via a bus 109. With an increase in the number of pixels (the number of photoelectric conversion units), there is concern of a communication bandwidth of an interface between the imaging element 102 and the image processing unit 110 being deficient. Accordingly, in the present embodiment, as described above, the imaging element 102 includes a compression unit to perform compression, so that a transmission amount is decreased even when the photoelectric conversion units with a higher number of pixels are included. Thus, data corresponding to the high number of pixels can be transmitted.

The image processing unit 110 includes an input unit 111, a decompression unit 112, a separation unit 113, an image processing circuit group 114, a recording unit 115, and an AF calculation unit 116. The input unit 111 receives encoded data transmitted from the output unit 108 of the imaging element 102 via the bus 109. The input unit 111 supplies the acquired encoded data to the decompression unit 112. The decompression unit 112 decompresses the encoded data supplied from the input unit 111 in accordance with a method corresponding to the compression method of the first compression unit 106 or the second compression unit 107 to restore the data, and then outputs the signal. The separation unit 113 performs a process of separating the signal output from the decompression unit 112 and inputs the separated signals to the image processing circuit group 114 and the AF calculation unit 116. In this example, the separation unit 113 inputs an image signal (imaging signal) for imaging, that is, viewing, to the image processing circuit group 114. The separation unit 113 outputs a focus detection signal to the AF calculation unit 118. The image processing circuit group 114 performs image processing based on the input signal.

The recording unit 115 generates and records recording digital data by performing, for example, a compression process such as JPEG on the data subjected to various kinds of image processing. The AF calculation unit 116 performs calculation regarding focus detection based on the focus detection signal input from the separation unit 113 and outputs a lens driving command based on a calculation result. The lens driving control unit 117 drives the focus lens included in the imaging optical system 101 based on the lens driving command output from the AF calculation unit 116.

Next, details of the imaging element 102 will be described. In the image pickup apparatus, the pixel units are arrayed two-dimensionally. The pixels included in the pixel units perform photoelectric conversion on the received light by the photoelectric conversion units 103 and output analog signals obtained through the photoelectric conversion as raw data to the A/D conversion unit 104. The raw data output from the A/D conversion unit 104 is input to the data switch unit 105. In this example, one microlens 204 is disposed to correspond to each pixel unit, so that an exit pupil of the imaging optical system is split, and thus the pixel unit includes a first photoelectric conversion unit 201 and a second photoelectric conversion unit 202 that perform photoelectric conversion on light fluxes passing through mutually different pupil regions. For example, an image A is output from the photoelectric conversion unit 201 and an image B is output from the photoelectric conversion unit 202. In this example, the pixels corresponding to the photoelectric conversion units 201 and 202 are set as effective pixels, that is, imaging pixels outputting imaging signals. An imaging signal (image A+B) is output from the effective pixels. The image A+B corresponds to an added signal of the images A and B. That is, the imaging element according to the present embodiment has a function of reading only the image A in a non-destructive manner and a function of adding charges of the photoelectric conversion units 201 and 202 and reading the charges as the image A+B.

The data switch unit 105 inputs an imaging signal which is a first signal to the first compression unit 106 and outputs a second signal (image A) for a different use from the first signal to the second compression unit 107. The raw data switched by the data switch unit 105 is output in predetermined units of encoding blocks and is input to the first compression unit 106 or the second compression unit 107. The encoding blocks refer to, for example, units such as 8×8 pixels used in a general compression algorithm of JPEG generation. In the present embodiment, encoding blocks in a 1-dimensional direction will be applied in description to facilitate the description. The present invention is easily applied even when the encoding blocks are developed in a two-dimensional direction.

Figure 2:
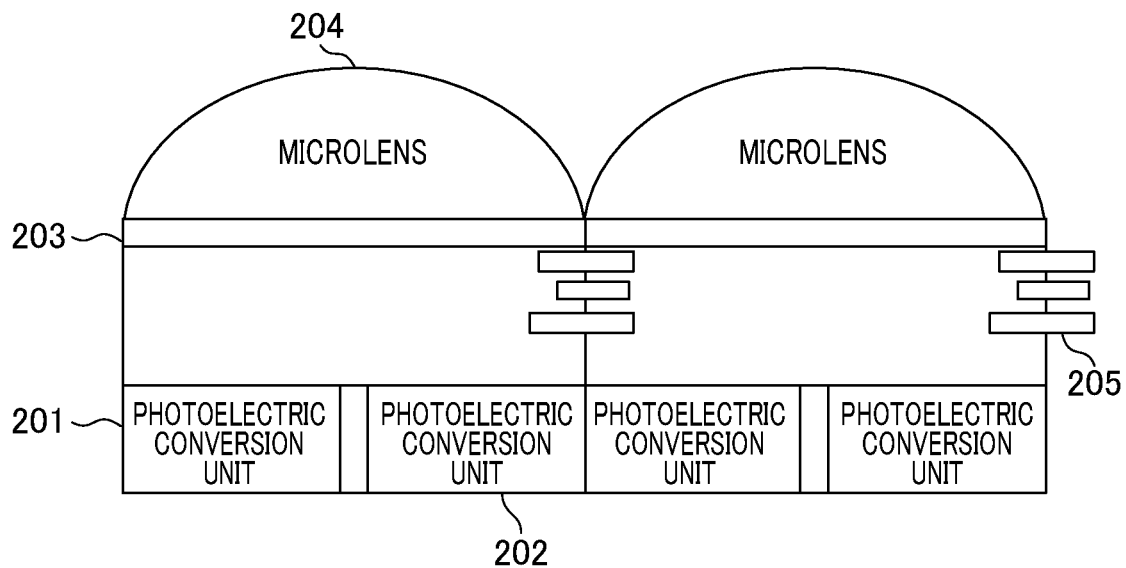
FIG. 2 is an example of a sectional view illustrating pixels of an imaging element.

Instead of the configuration illustrated in FIG. 2, the pixel unit disposed in the imaging element may have any configuration which includes effective pixels outputting imaging signals subjected to image processing and functional pixels outputting signals subjected to a different process from the image processing by a functional processing unit such as the AF calculation unit 116. For example, when the pixel unit includes effective pixels and the functional pixels outputting a focus detection signal, the data switch unit 105 outputs an output of the effective pixels to the first compression unit 106 and outputs an output of focus detection pixels to the second compression unit 107. For example, when the pixel unit includes effective pixels and optical black pixels (OB pixels) outputting a dark current detection signal, the data switch unit 105 outputs an output of the effective pixels to the first compression unit 106 and outputs an output of the OB pixels to the second compression unit 107.

The first compression unit 106 and the second compression unit 107 receive raw data in units of encoding blocks output from the data switch unit 105 and generate encoded data by performing a predetermined encoding process.

FIG. 2 is an example of a pixel sectional view illustrating the imaging element. One microlens 204 is provided for the pixel unit including the photoelectric conversion units 201 and 202. Reference numeral 203 denotes a color filter and reference numeral 205 denotes a wiring layer. By providing two photoelectric conversion units for one microlens, it is possible to perform pupil splitting and perform focus detection using a phase difference between images obtained from the photoelectric conversion units. By adding outputs of the photoelectric conversion units 201 and 202, it is possible to obtain an image (image A+B) in which a pupil is not split. The color filter 203 includes red (R), green (G), and blue (B) filters in a Bayer array. Accordingly, by adding the outputs of the photoelectric conversion units 201 and 202, it is possible to obtain a color image.

Figure 3:
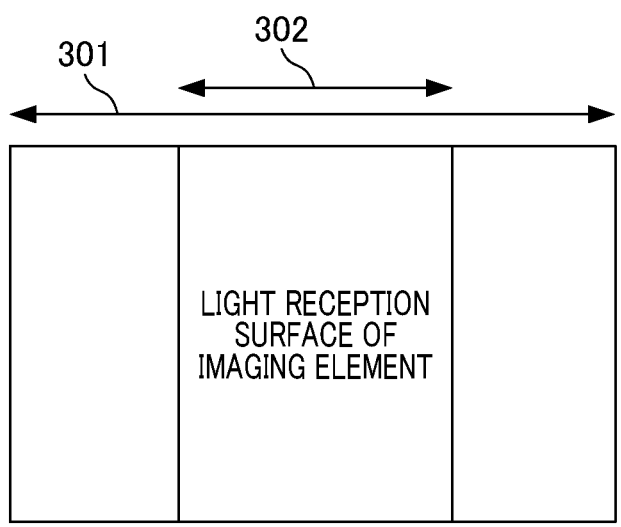
FIG. 3 is a diagram illustrating a light reception surface of the imaging element.

FIG. 3 is a diagram illustrating a light reception surface of the imaging element. A width 301 corresponds to an area of the effective pixels of the entire imaging element. The area is a reading area of the image A+B. The width 302 is an image A readable area. To shorten a reading time from the imaging element, only an area used for the focus detection is designed as an area from which the image A is read.

Figure 4:
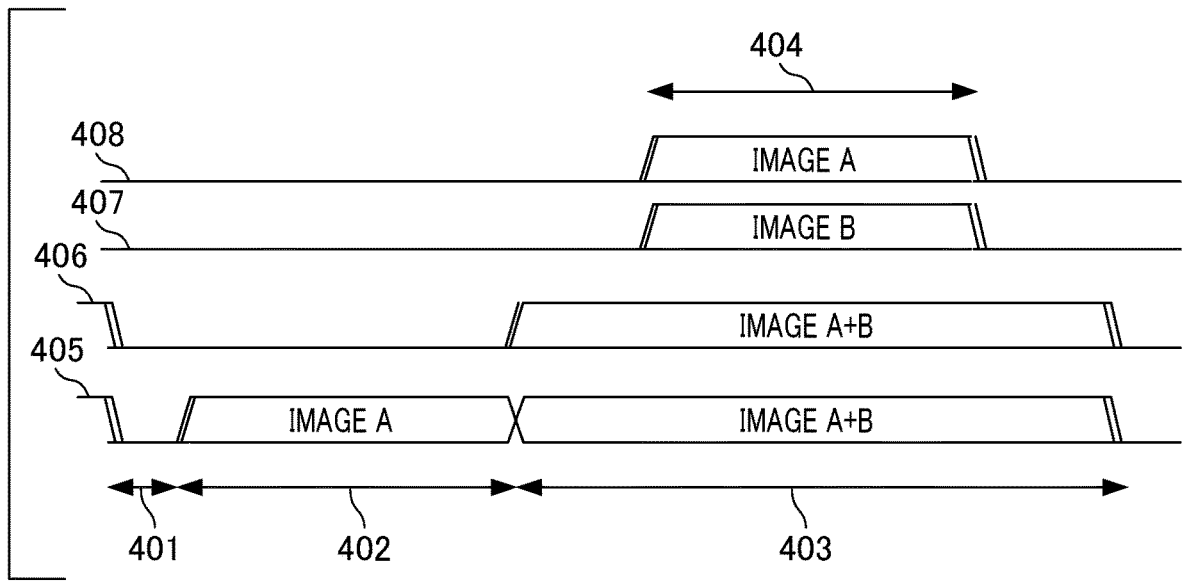
FIG. 4 is a diagram illustrating a reading timing of a signal from the imaging element.

FIG. 4 is a diagram illustrating a reading timing of a signal from the imaging element. Reference numeral 405 denotes a reading signal for one horizontal period from the imaging element. A period 401 is a horizontal blanking period. A period 402 is a reading period of the image A. A period 403 is a reading period of the image A+B. In this way, only the image A or only the image B can be read in a shorter horizontal period than an individual reading period. The image pickup apparatus according to the present embodiment obtains the image B by subtracting the image A from the image A+B read by the separation unit 113 illustrated in FIG. 1. The data switch unit 105 outputs the image A to the second compression unit 107 during the period 402 and outputs the image A+B to the first compression unit 106 during the period 403.

Figure 5:
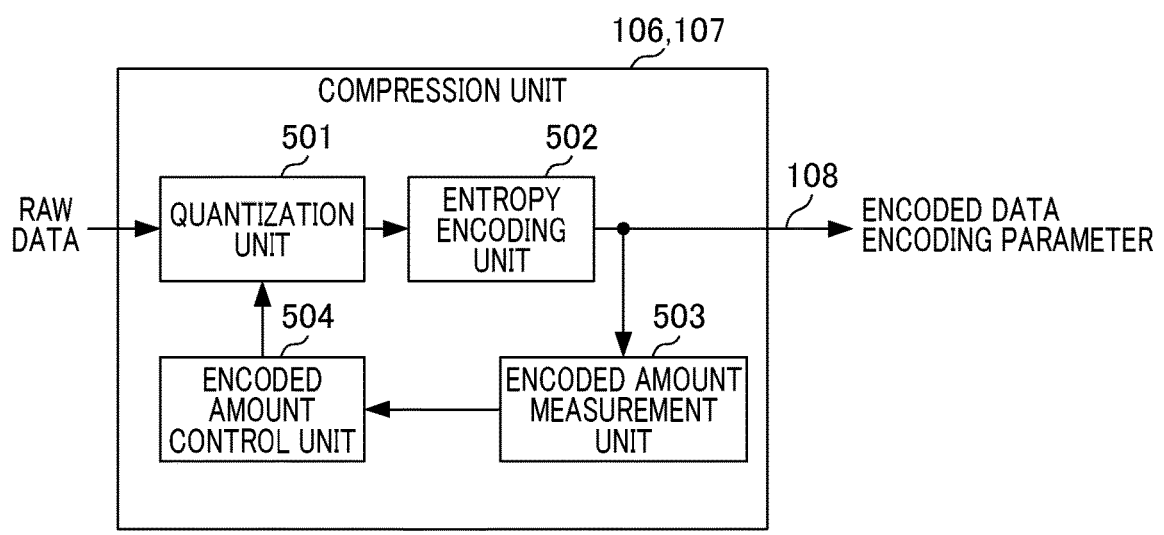
FIG. 5 is a diagram illustrating an example of the configuration of a compression unit included in the imaging element.

FIG. 5 is a diagram illustrating an example of the configuration of the compression unit included in the imaging element. The first compression unit 106 and the second compression unit 107 each include a quantization unit 501, an entropy encoding unit 502, an encoded amount measurement unit 503, and an encoded amount control unit 504. The quantization unit 501 is a circuit that extracts a difference value of the raw data between the pixels (hereinafter referred to as a difference value) and generates quantized data of the difference value. The entropy encoding unit 502 is a circuit that assigns a sign to each piece of quantized data based on the frequency of appearance of input data (symbol) and generates encoded data. As an entropy encoding scheme, Golomb encoding and Huffman encoding are known. The invention is not limited to such an encoding scheme. The encoded amount measurement unit 503 is a circuit that measures an encoding data amount in units of encoding blocks. The encoded amount control unit 504 is a circuit that controls an encoded amount and outputs encoded data based on the encoding data amount measured by the encoded amount measurement unit 503.

Figure 6:
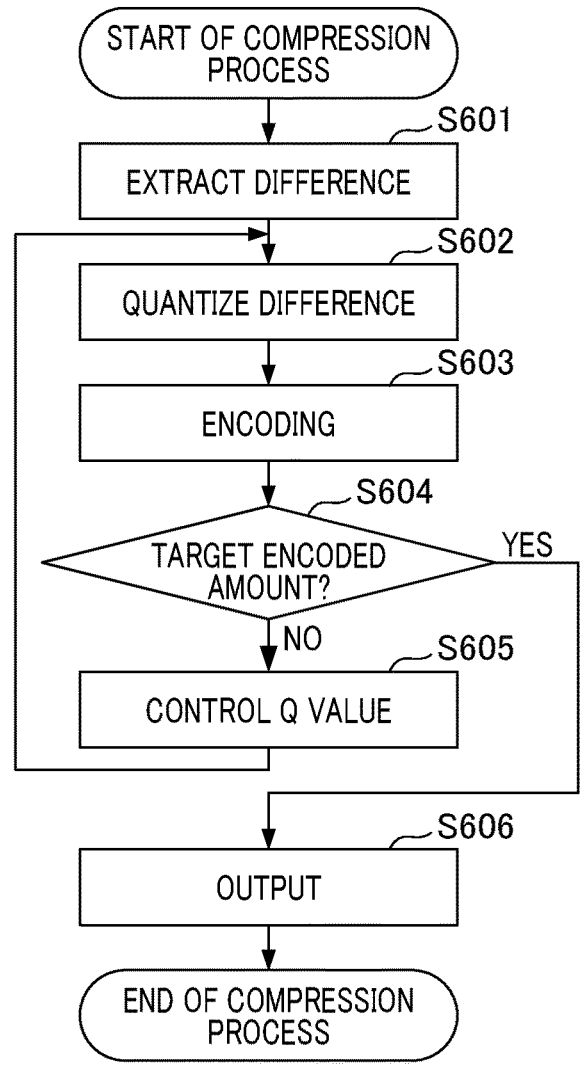
FIG. 6 is a flowchart illustrating a process performed by the compression unit.

FIG. 6 is a flowchart illustrating a process performed by the compression unit. When a compression process starts, the raw data in units of encoding blocks is input to the quantization unit 501. In S601, the quantization unit 501 calculates a difference value between adjacent pixels in an encoding block. Subsequently, in S602, the quantization unit 501 quantizes the difference value calculated in S601 using a predetermined value. The predetermined value is a parameter for deciding a quantization step and is dynamically decided by the encoded amount control unit 504. Hereinafter, the predetermined value is described as a quantization parameter (QP). The difference value QP is subtracted and a decimal part of the subtraction result is rounded off in the quantization.

Next, in S603, the entropy encoding unit 502 assigns a sign to the quantized difference value. In S604, the encoded amount measurement unit 503 determines whether the encoded data falls in a target data amount (target encoded data amount). In the present embodiment, an encoded data amount falling in the bandwidth of the bus 109 is set in the target encoded data amount.

Here, a second signal (the dark current detection signal from the image A or the OB pixels or the focus detection signal from the focus detection pixels) with a data amount less than output data from the effective pixels is input to the second compression unit 107. When such a signal is subjected to the same compression process as the compression process performed by the first compression unit 106, the signal may deteriorate, and thus there is concern of focus precision deteriorating or image quality of the entire effective pixel region deteriorating. Accordingly, in the second compression unit 107, a target encoded data amount greater than the target encoded data amount set in the first compression unit 106 is set to prevent the image quality from deteriorating. Alternatively, to eliminate the deterioration in the image quality caused in the compression process, a non-compression process can be selected and performed without performing processes from S601 to S604. That is, the second compression unit 107 functions as a control unit that performs a different process from the compression process performed by the first compression unit 106 so that the second signal does not deteriorate. The second compression unit 107 performs one of a non-compression process, a lossless compression process, and a non-lossless compression process of assigning more quantization bits than in the compression process performed by the first compression unit 106 on the second signal.

When it is determined in step S604 that the encoded data does not fall in the target encoded data amount, the process proceeds to S605. Then, the encoded amount control unit 504 controls the encoded amount such that the encoded data falls in the target encoded data amount by increasing or decreasing the QP according to a difference between the encoded data amount and the target encoded data amount.

When it is determined in step S604 that the encoded data falls in the target encoded data amount, the process proceeds to S606 to output the encoded data. At the time of the outputting, the QP used in the quantization of each encoding block or sign assignment information at the time of encoding (hereinafter referred to as an "encoding parameter") is output to the output unit 108 in association with output data.

The output unit 108 sequentially outputs the encoded data compressed by the first compression unit 106 and the encoded data compressed by the second compression unit 107. The output data in the output unit 108 may be switched in consideration of a time taken in the process by the compression unit with respect to a switch timing of the above-described data switch unit 105.

Next, details of the process by the decompression unit 112 will be described. When the encoded data and the encoding parameter are input from the input unit 111 to the decompression unit 112, the decompression unit 112 reads information necessary in the decompression process for the QP from the encoding parameter. The decompression unit 112 performs the decompression process for the encoded data based on the read information necessary in the decompression process.

Figure 7:
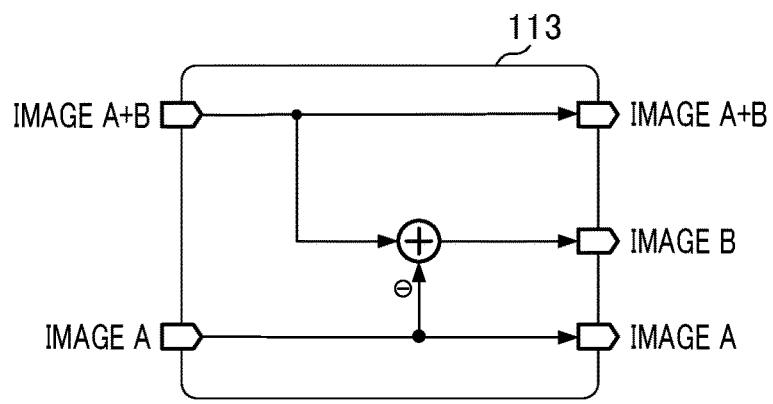
FIG. 7 is a diagram illustrating an internal circuit of a separation unit and input and output signals.

FIG. 7 is a diagram illustrating an internal circuit of a separation unit and input and output signals. Details of the process by the separation unit 113 will be described with reference to FIG. 7. In the example illustrated in FIG. 7, the separation unit 113 reads the image A+B decompressed by the decompression unit 112 and the image A and generates the image B by subtracting the image A from the image A+B. When right and left signals of the images A and B are generated, a phase difference occurs in the horizontal direction. The separation unit 113 outputs the data of the images A and B as the focus detection data to the AF calculation unit 116. The AF calculation unit 116 calculates a defocus amount by obtaining a deviation amount of the images A and B.

The separation unit 113 outputs the data of the image A+B as the imaging data to the image processing circuit group 114. The image processing circuit group 114 generates a recording video signal by performing, for example, known image processing such as color conversion, white balance, or gamma correction, a resolution conversion process, or an image compression process such as JPEG on the imaging data.

The image pickup apparatus according to the present embodiment performs a different process from the first compression process on the second signal (the image A, the focus detection signal, or the dark current detection signal) different from the first signal which is output from the effective pixels and on which the first compression process is performed so that the second signal does not deteriorate. Accordingly, it is possible to reduce the deterioration in the signal used for the focus detection or the calculation of a dark current value while enabling a large amount of data to be transmitted without an increase in the bandwidth of the transmission path.

Second Embodiment

An image pickup apparatus according to a second embodiment reduces deterioration in a signal regarding a main subject in effective pixels. Therefore, the image pickup apparatus drives a focus lens within a predetermined range from an optimum focus position and adjusts a focus position through a refocus process after photographing.

Figure 8:
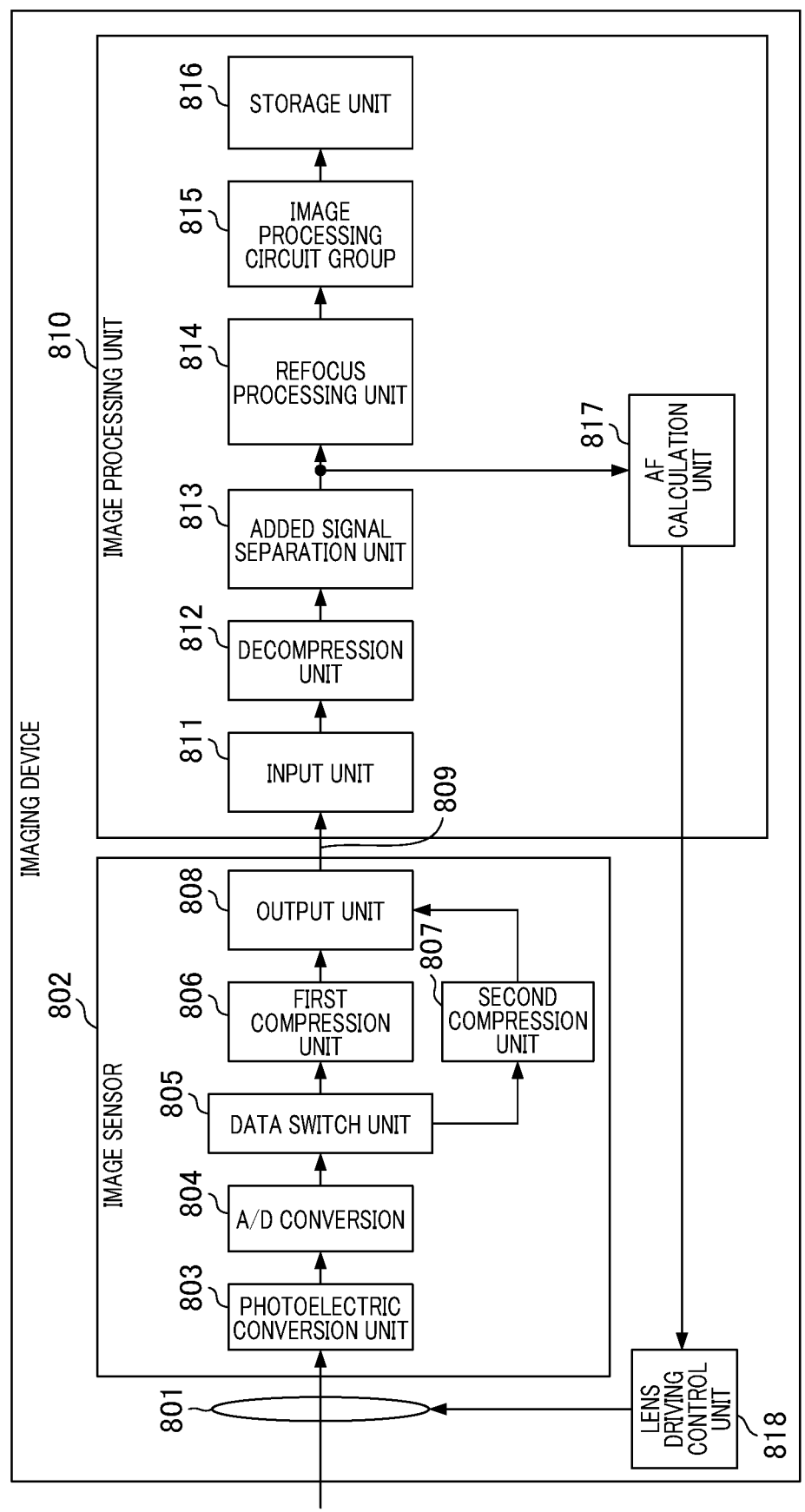
FIG. 8 is a diagram illustrating the configuration of an image pickup apparatus according to a second embodiment.

FIG. 8 is a diagram illustrating the configuration of the image pickup apparatus according to the second embodiment. An imaging element 802 is the same as the imaging element 102 included in the image pickup apparatus according to the first embodiment, and thus the description thereof will be omitted. Encoded data of an image A+B and an image A output by an output unit 808 is supplied to an input unit 811 of an image processing unit 810 via a bus 809 to be subjected to a decompression process by a decompression unit 812. A separation unit 813 generates a signal of an image B from the image A+B and the image A and outputs the signal as focus detection data to an AF calculation unit 817. Hereinafter the details of the AF calculation unit 817 will be described. The AF calculation unit 817 is a block that mainly performs correlation calculation and performs a focus adjustment process using the images A and B in accordance with a phase difference scheme.

Figure 9:
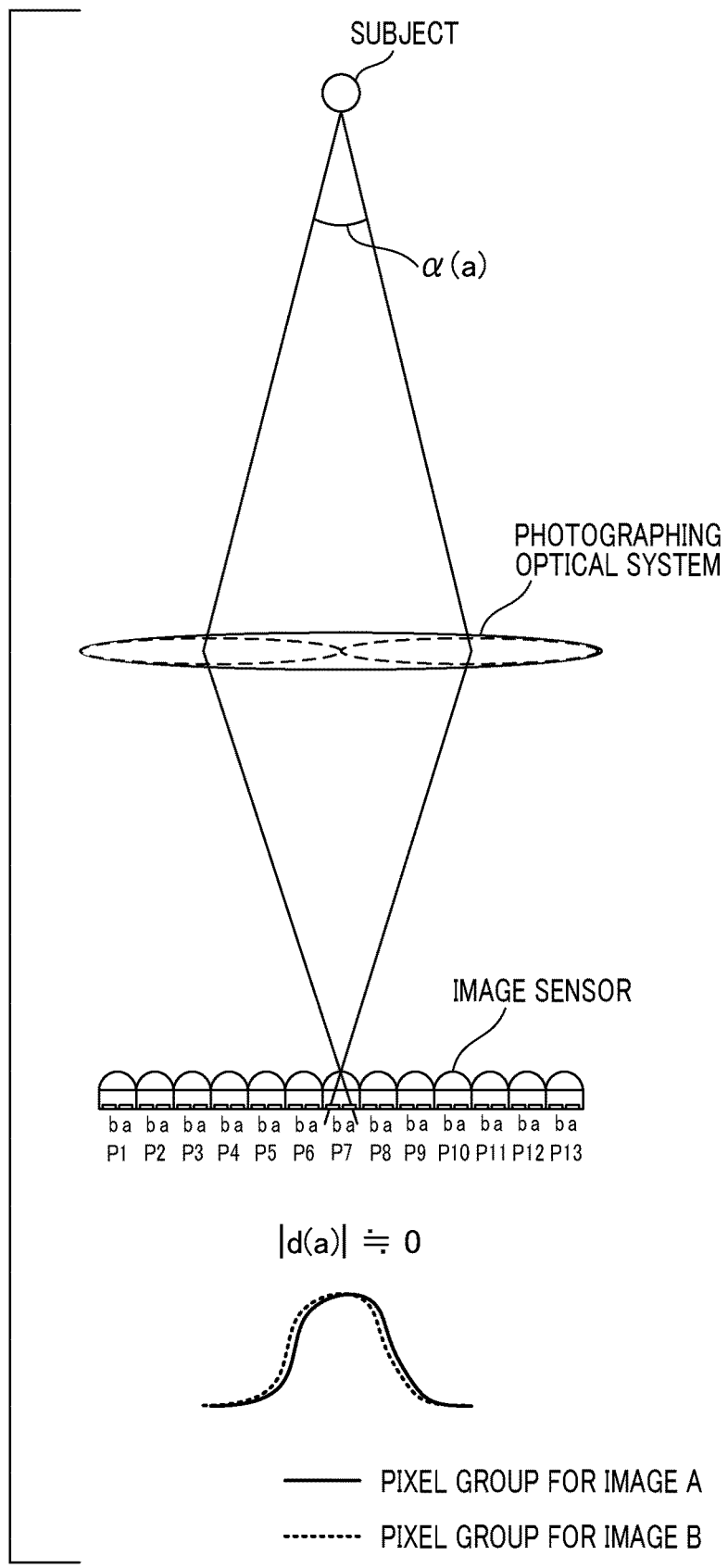
FIG. 9 is a diagram illustrating an example of a focus adjustment process.
Figure 10:
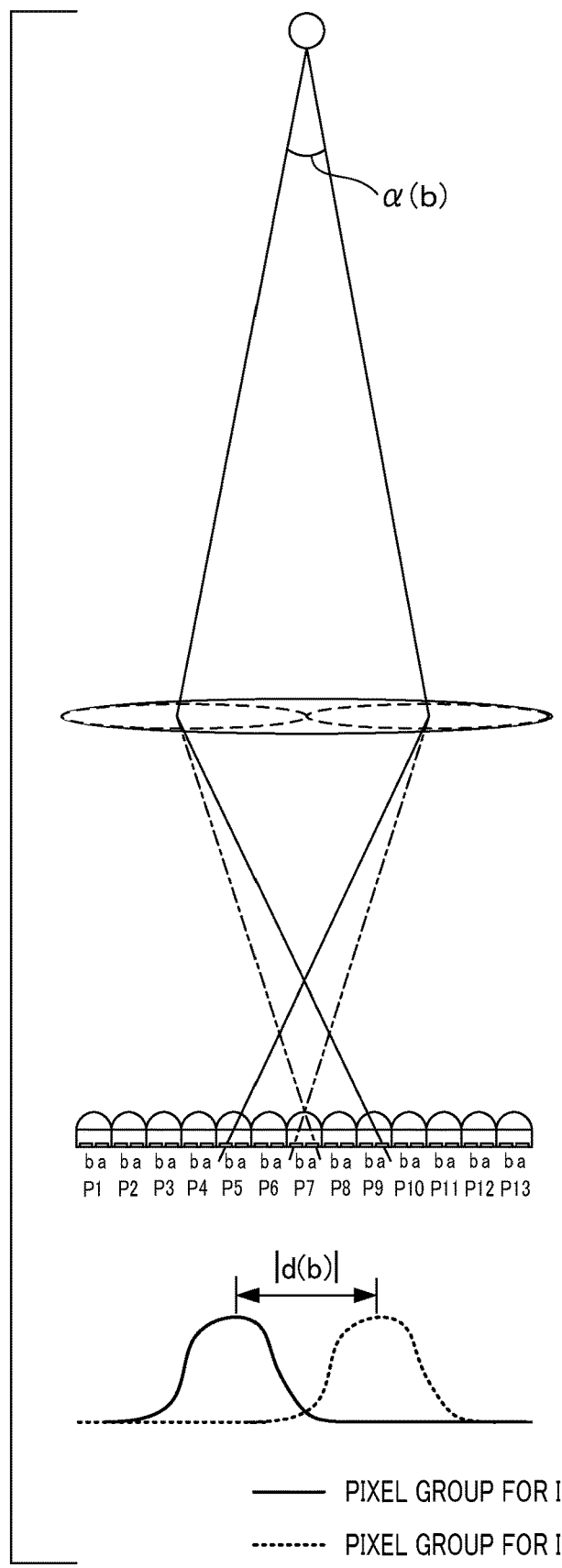
FIG. 10 is a diagram illustrating an example of a focus adjustment process.
Figure 11:
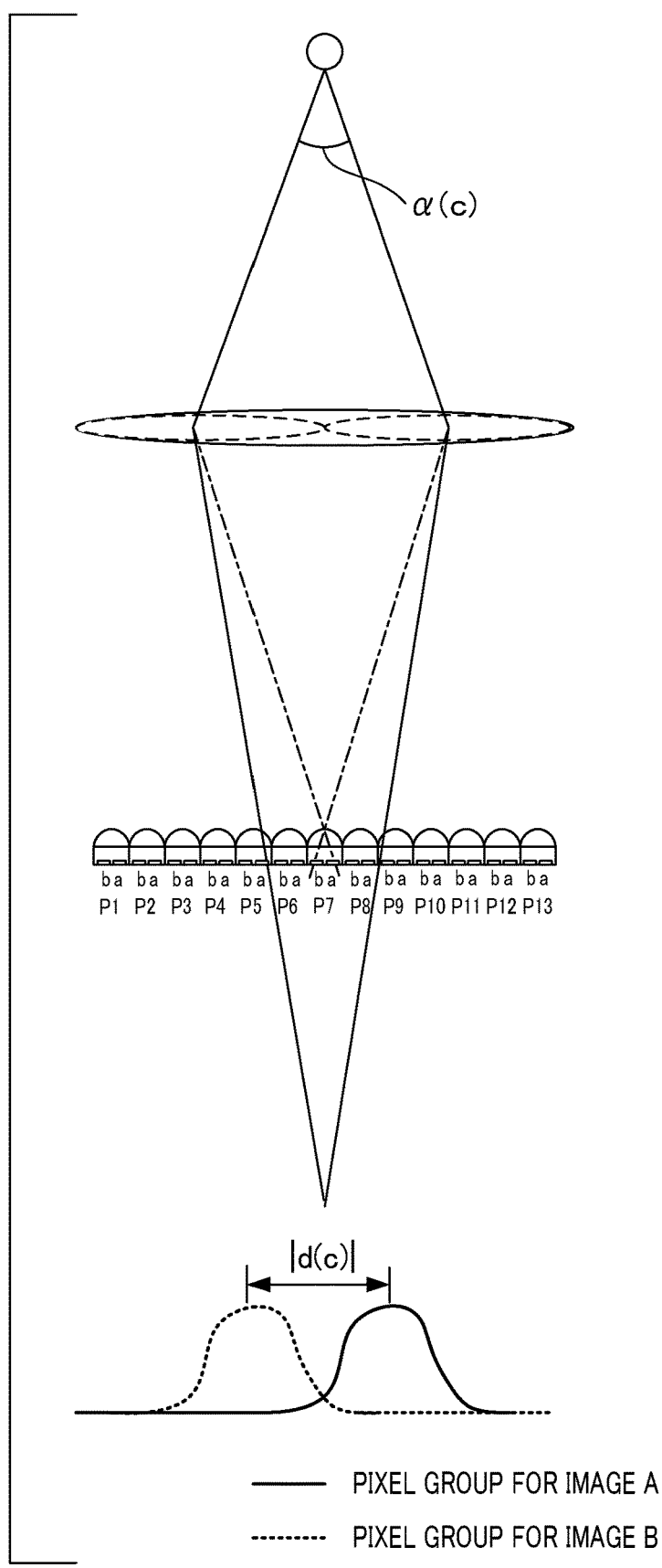
FIG. 11 is a diagram illustrating an example of a focus adjustment process.

FIGS. 9 to 11 are diagrams illustrating an example of a focus adjustment process using two images read from the imaging element. A principle of the focus adjustment process in which correlation calculation (Sum of Absolute Difference: SAD) using the images A and B is used will be described. In the imaging element illustrated in FIGS. 9 to 11, a plurality of unit pixel cells P including pixels a and b disposed separately under one microlens are disposed. The imaging element is the same as the imaging element described with reference to FIG. 2. The pixels a and b are pixels for which the microlens is split into pupils as exit pupils.

The AF calculation unit 817 combines pixel outputs for the images A and B formed by the pixels a and b in the row direction or the column direction to generate and digitize the images A and B as outputs of the same color unit pixel cell groups and obtain a deviation of each correspondence point by SAD calculation. A result of the SAD calculation can be obtained by the following formula (1).

$$C = |YA_n - YB_n| \qquad \text{formula (1)}$$

Here, n is the number of horizontal microlenses. Values at the time of shifting of correspondence pixels with respect to $YB_n$ are plotted and a small deviation amount of the smallest value is a focus position.

Since a position at which a photographing optical system forms an image at the time of focusing is a PD under the microlens P7 in the drawing, a pixel group for the image A and a pixel group for the image B are substantially identical. At this time, as illustrated in FIG. 9, an image deviation amount d(a) between the pixel group for the image A and the pixel group for the image B obtained through the correlation calculation is approximately 0. At the time of back focus, the pixels for the image A become the pixels under the microlens P5 and the pixels for the image B become the pixels under the microlens P9 as positions at which the photographing optical system forms an image. At this time, as illustrated in FIG. 10, an image deviation amount d(b) occurs between the pixel group for the image A and the pixel group for the image B obtained by the correlation calculation. At the time of front focus, the pixels for the image A become the pixels under the microlens P9 and the pixels for the image B become the pixels under the microlens P5 as positions at which the photographing optical system forms an image. At this time, as illustrated in FIG. 11, an image deviation amount between the pixel group for the image A and the pixel group for the image B obtained by the correlation calculation is an image deviation amount d(c) in an opposite direction to the image deviation amount at the time of the back focus. This means that, while the same subject is seen in the pixel groups for the images A and B at the time of focus, a subject signal in which the image deviation amount d is deviated between the pixel groups for the images A and B is output at the time of the back focus and the front focus. A defocus amount obtained from a base line length and the image deviation amount d which is the minimum value of the added value of the obtained SAD values by a known technology is output to the AF calculation unit 817. Focus adjustment control is performed by moving the imaging optical system 801 via a lens driving control unit 818.

FIGS. 12A and 12B are diagrams illustrating change amounts of pixel values when a main subject is in focus and out of focus. To facilitate the description, the horizontal axis represents a pixel position and the vertical axis represents a pixel value. A subject is assumed to be a subject which is dark on the left side and bright on the right side. FIG. 12A illustrates a pixel position and a pixel value when the main subject is out of focus. FIG. 12B illustrates a pixel position and a pixel value when the main subject is in focus. When the main subject is out of focus, a change amount of the pixel value is small. When the main subject is in focus, the change amount of the pixel value is large. Accordingly, when the main subject is in focus, a QP used in quantization of the difference value by the quantization unit 501 is increased. As a result, when a sign is assigned to a quantized difference value, the encoded data does not fall in the target encoded data amount and the QP may be assigned so that the encoded data falls in the target encoded data amount. This means that a region in which the main subject is in focus is a region in which an image considerably deteriorates. That is, the image considerably deteriorates for the main subject and the image does not considerably deteriorate for a portion other than the main subject.

Next, a process of a refocus processing unit 814 will be described in detail. The refocus processing unit 814 generates a refocus image which is an image in which a focus surface is virtually moved by shifting the obtained images A and B by a predetermined number of pixels and adding the images A and B.

Figure 13:
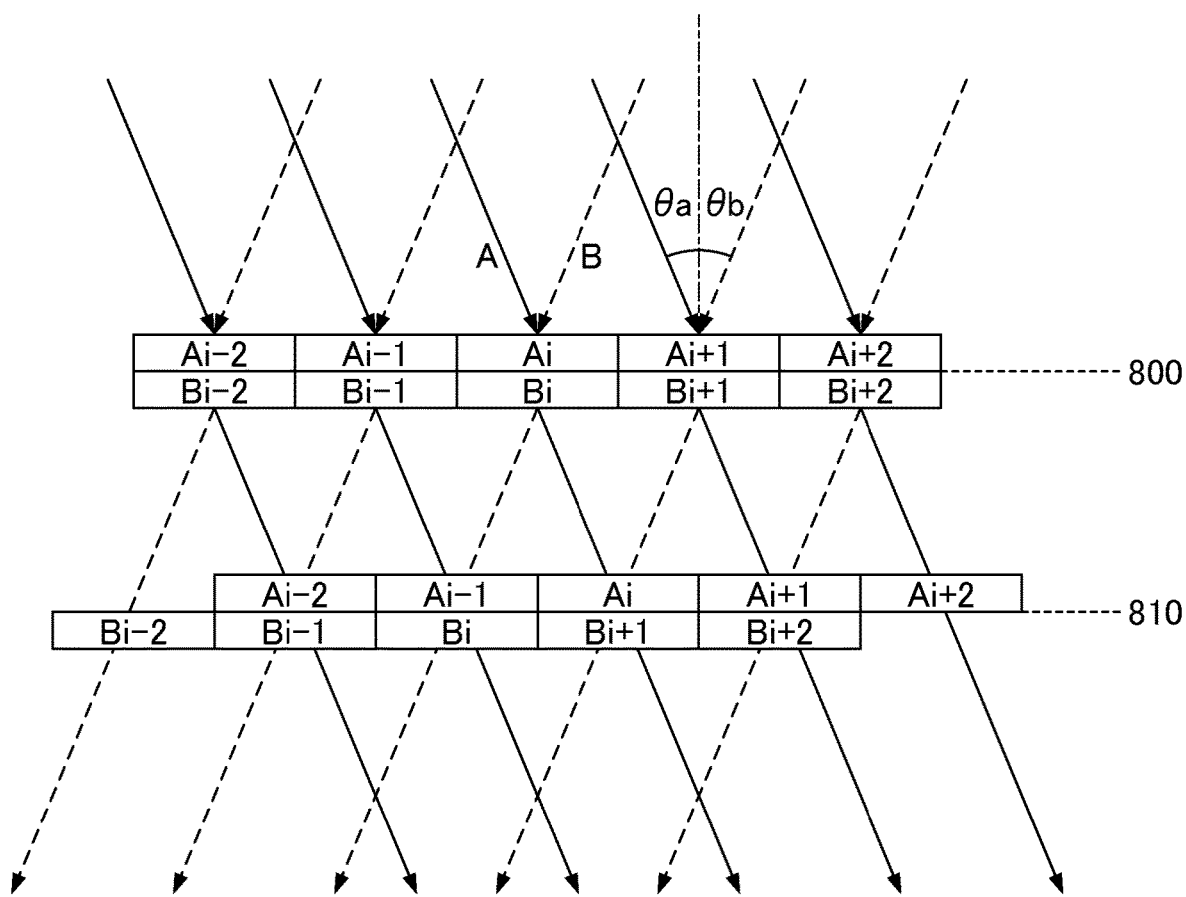
FIG. 13 is a diagram illustrating a refocus process.

FIG. 13 is a diagram illustrating a refocus process. A focus surface 800 is an upper surface of the imaging element on which an image is formed with the imaging optical system 801. In FIG. 13, i is an integer, and Ai and Bi schematically indicate a signal for the image A and a signal for the image B of an i-th pixel in the column direction of the imaging element disposed on an imaging surface 800, respectively. Ai, which is the pixel for the image A, is a light-receiving signal of a light flux incident on the i-th pixel at a principal ray angle θa. Bi, which is the pixel for the image B, is a light-receiving signal of a light flux incident on the i-th pixel at a principal ray angle θb.

Ai and Bi include not only light intensity distribution information but also incidence angle information. Accordingly, a refocus image (refocus signal) on a virtual focal surface 810 can be generated by moving Ai in parallel up to the virtual focal surface 810 along the angle θa, and moving Bi in parallel up to the virtual focal surface 810 along the angle θb, and adding Ai and Bi.

The parallel movement of Ai up to the virtual focal surface 810 along the angle θa corresponds to a +0.5 pixel shift in the column direction. The parallel movement of Bi up to the virtual imaging surface 810 along the angle θb corresponds to a −0.5 pixel shift in the column direction. Accordingly, the focus image on the virtual focal surface 810 can be generated by shifting Ai and Bi relatively by +1 pixel, causing Ai and Bi+1 to correspond to each other, and adding Ai and Bi+1. Further, a refocus image which is a shift addition image on each virtual imaging surface can be generated according to an integer shift amount by shifting Ai and Bi by an integer and adding Ai and Bi.

Figure 14:
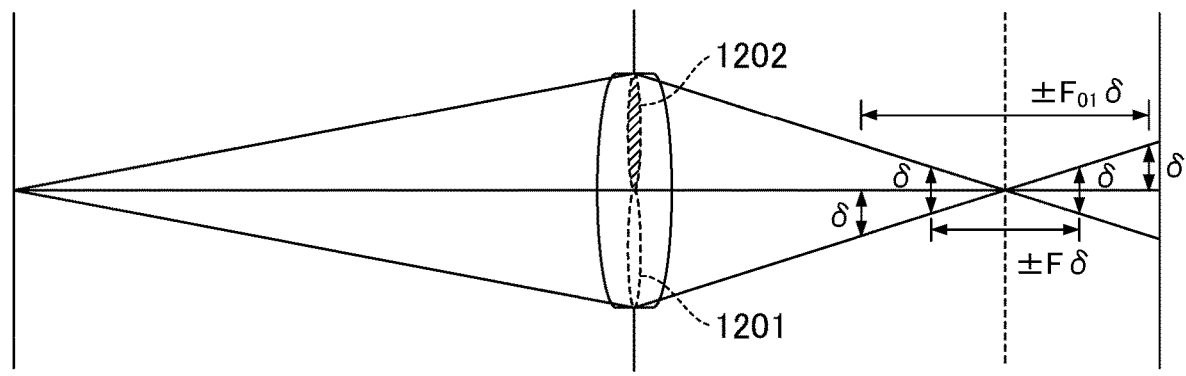
FIG. 14 is a diagram illustrating a refocusable range.

FIG. 14 is a diagram illustrating a refocusable range. When δ is a permissible circle of confusion and F is an aperture value of an image formation optical system, a depth of field at the aperture value F is ±Fδ. On the other hand, an effective aperture value F01 (F02) in the horizontal direction of the pupil region 1201 (1202) split and narrowed as two regions is F01=2F to be darkened when the number of split regions is 2. The effective depth of field of the pixel group for the images A and B is deepened twice as ±2Fδ and a focus range is widened twice. Within the range of the effective depth of field ±2Fδ, a subject image focused in the pixel group for the images A and B is acquired. Accordingly, a focus position can be readjusted (refocused) after photographing through a refocus process of moving the pixel group for the images A and B parallel along the principal ray angle θa (θb) illustrated in FIG. 13.

A defocus amount d from the imaging surface on which the focus position can be refocused after the photographing is restricted, and thus a refocusable range of the defocus amount d is a range indicated generally by formula (2).

$$|d| \leq 2F\delta \qquad \text{formula (2)}$$

The permissible circle of confusion δ is defined as δ=2ΔX (which is the reciprocal of a Nyquist frequency 1/(2ΔX) of a pixel period ΔX) or the like. When the refocus process is performed using the images A and B split into two images in one microlens and d is equal to or less than 2Fδ, refocus can be performed. When d is less than 1Fδ, the defocus amount is within the permissible circle of confusion.

To prevent image quality from deteriorating due to compression of a main subject in the imaging element, the image pickup apparatus decreases a difference value in the pixel value in the main subject by driving the focus lens within a range satisfying formula (3) from an optimum focus position and causes the encoded data to fall in the target encoded data amount. Then, the refocus processing unit 814 reduces the deterioration in the image quality by performing the refocus process at the original optimum focus position.

$$1F\delta \leq |d| \leq 2F\delta \qquad \text{formula (3)}$$

That is, the lens driving control unit 818 functions as a driving unit that performs driving control on the focus lens such that a focus surface is shifted from a focus surface of a target subject by a predetermined distance for imaging.

Effective image data subjected to the refocus process by the refocus processing unit 814 is output to the image processing circuit group 815. Then, the image processing circuit group 815 generates a recording video signal by performing, for example, known image processing such as color conversion, white balance, or gamma correction, a resolution conversion process, or an image compression process such as JPEG on the effective image data.

In the first and second embodiments, two photoelectric conversion units are disposed in one microlens. Even when four or more photoelectric conversion units are present, the same advantages can be obtained. Although preferred embodiments of the present invention have been described, the invention is not limited to these embodiments and can be modified and changed in various forms within the scope of the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-112013, filed Jun. 2, 2015 which is hereby incorporated by reference wherein in its entirety.

What is claimed is:

1. An imaging element comprising:
   a plurality of pixels that receive incident light and includes a photoelectric convertor respectively performing photoelectric conversion of the incident light to generate a plurality of output signals;
   a compressor that performs a first compression process on a first signal and performs a second compression process, different from the first compression process, on a second signal, which is an output from a non-imaging pixel, so that the second signal does not deteriorate, the second signal being for a different use than the first signal, and not for the image output use, wherein said first signal is an addition signal of outputs from plurality of pixels among the pixels for which pupil regions of an optical imaging system are different;
   a controller that performs controls a parameter of at least one of the first compression process and the second compression process; and
   output pins that output-the first signal on which a decompression process is performed by an external decompressor for displaying and the second signal processed by the compressor to the outside of the imaging element via an output bus.

2. An image pickup apparatus comprising:
   an imaging element comprising:
   a plurality of pixels that receive incident light and includes a photoelectric convertor respectively performing photoelectric conversion of the incident light to generate a plurality of imaging signals;
   a compressor that performs a first compression process on a first signal which is an imaging signal output from the plurality of pixels and performs a second compression process, different from the first compression process, on a second signal, which is an output from a non-imaging pixel, so that the second signal does not deteriorate, the second signal being for a different use than the first signal, and not for the image output use;
   a controller that controls a parameter of at least one of the first compression process and the second compression process; and output pins that output the first signal on which a decompression process is performed by an external decompressor for displaying and the second signal processed by the compressor to the outside of the imaging element via an output bus;

the image pickup apparatus further comprising:

a refocus processor that generates a refocus signal for moving a focus surface virtually based on the first and second signals; and a lens driver that performs driving control on a focus lens such that a focus surface is shifted from a focus surface of a target subject by a predetermined distance for imaging.

3. A method for controlling an imaging element of an image pickup apparatus, the imaging element comprising a plurality of pixels that receive incident light and includes a photoelectric convertor respectively performing photoelectric conversion of the incident light to generate a plurality of imaging signals, the method comprising:

performing a first compression process on a first signal that is the imaging signal output from the plurality of pixels and performing a second compression process, different from the first compression process, on a second signal, which is an output from a non-imaging pixel, so that the second signal does not deteriorate, the second signal being for a different use than the first signal, and not for the image output use;

controlling a parameter of at least one of the first compression process and the second compression process;

outputting the first signal on which a decompression process is performed by an external decompressor for displaying and the second signal processed in the process to the outside of the imaging element via an output bus;

receiving by the external decompressor the first signal and the second signal via the bus, and decompressing the first signal and the second signal; and performing a compression process on the first signal again.

4. A non-transitory storage medium storing a computer program causing a computer to perform a method for controlling an imaging element of an image pickup apparatus, the imaging element comprising a plurality of pixels that receive incident light and includes a photoelectric convertor respectively performing photoelectric conversion of the incident light to generate a plurality of imaging signals, the method comprising:

performing a first compression process on a first signal that is the imaging signal output from the plurality of pixels and performing a second compression process, different from the first compression process performed on the first signal, on a second signal, which is an output from a non-imaging pixel, so that the second signal does not deteriorate, the second signal being for a different use than the first signal, and not for the image output use;

controlling a parameter of at least one of the first compression process and the second compression process;

outputting the first signal on which a decompression process is performed by an external decompressor for displaying and the second signal processed in the process to the outside of the imaging element via an output bus;

receiving by the external decompressor the first signal and the second signal via the bus, and decompressing the first signal and the second signal; and performing a compression process on the first signal again.

5. An image pickup apparatus comprising:

an imaging element comprising:

a plurality of pixels that receive incident light and includes a photoelectric convertor respectively performing photoelectric conversion of the incident light to generate a plurality of imaging signals;

a compressor that performs a first compression process on a first signal which is an imaging signal output from the plurality of pixels and performs a second compression process, different from the first compression process, on a second signal, which is an output from a non-imaging pixel, so that the second signal does not deteriorate, the second signal being for a different use than the first signal, and not for the image output use;

a controller that controls a parameter of at least one of the first compression process and the second compression process; and output pins that output the first signal on which a decompression process is performed by an external decompressor for displaying and the second signal processed by the compressor to the outside of the imaging element via an output bus;

the image pickup apparatus further comprising:

the external decompressor configured to receive the first signal and the second signal via the bus to decompress the first signal and the second signal; and an image processing circuit group that performs the compression process on the first signal again.

6. The apparatus according to claim 5, wherein the second compression process performed by the controller on the second signal comprises one of a group of a non-compression process, a lossless compression process, and a non-lossless compression process in which more quantization bits are used than in the compression process performed on the first signal.

7. The apparatus according to claim 5, wherein the photoelectric conversion includes a first photoelectric convertor and a second photoelectric convertor arranged to perform photoelectric conversion on the incident light passing through respective different pupil regions of an optical imaging system, wherein the first signal is a signal output from the first and second photoelectric convertor, and wherein the second signal is a signal output from the second photoelectric convertor.

8. The apparatus according to claim 5, wherein the plurality of pixels includes an imaging pixel and a focus detection pixel, wherein the first signal is an imaging signal output from the imaging pixel, and wherein the second signal is a focus detection signal output from the focus detection pixel.

9. The apparatus according to claim 5, wherein the plurality of pixels includes an imaging pixel and an optical black pixel, wherein the first signal is an imaging signal output from the imaging pixel, and wherein the second signal is a dark current detection signal output from the optical black pixel.

10. The apparatus according to claim 5, further comprising:

an image processor that performs image processing using the first signal; and a functional processor that performs a different process from the image processing using the second signal.

11. The apparatus according to claim 5, wherein the first signal is acquired from an area of the effective pixels of the entire imaging element, and wherein the second signal is acquired from a part of the area.

12. The apparatus according to claim 5, wherein the encoded data amount of the second signal is greater than the encoded data amount of the first signal.

13. The apparatus according to claim 5, wherein the amount of signals transferred via the bus is less than the amount of signals read from each pixel.

14. An image pickup apparatus comprising:
an imaging element comprising:
    a plurality of pixels at receive incident light and includes a photoelectric convertor respectively performing photoelectric conversion of the incident light to generate a plurality of imaging signals;
    a compressor that performs a first compression process on a first signal which is an imaging signal output from the a first area of plurality of pixels and performs a second compression process, different from the first compression process, on a second signal output from a second area different from the first area of the plurality of pixels, the second signal being for a different use from the first signal, and not for the image output use;
    a controller that controls a parameter of the first compression process and the second compression process so that compression rate of the first compression process is higher than that of the second compression process; and
    output pins that output the first signal and the second signal on which a decompression process is performed by an eternal decompressor to the outside of the imaging element via an output bus;
the image pickup apparatus further comprising:
the external decompressor configured to receive the first signal and the second signal via the bus to decompress the first signal and the second signal; and
an image processing circuit group that performs the compression process on the first signal again.

\* \* \* \* \*